(12) United States Patent
Katanoda

(10) Patent No.: US 11,180,031 B2
(45) Date of Patent: Nov. 23, 2021

(54) VEHICLE

(71) Applicant: TOYOTA JIDOSHA KABUSHIKI KAISHA, Toyota (JP)

(72) Inventor: Tomoya Katanoda, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 95 days.

(21) Appl. No.: 16/218,673

(22) Filed: Dec. 13, 2018

(65) Prior Publication Data

US 2019/0202292 A1 Jul. 4, 2019

(30) Foreign Application Priority Data

Dec. 28, 2017 (JP) .............................. JP2017-253441

(51) Int. Cl.
*B60L 1/00* (2006.01)
*B60L 53/18* (2019.01)
*B60L 58/12* (2019.01)
*H02J 7/00* (2006.01)
*B60L 55/00* (2019.01)
*G01R 31/382* (2019.01)

(52) U.S. Cl.
CPC ............... *B60L 1/006* (2013.01); *B60L 53/18* (2019.02); *B60L 55/00* (2019.02); *B60L 58/12* (2019.02); *H02J 7/0063* (2013.01); *B60L 2260/52* (2013.01); *G01R 31/382* (2019.01); *H02J 2007/0067* (2013.01)

(58) Field of Classification Search
CPC .......... B60L 1/006; B60L 55/00; B60L 53/18; B60L 58/12; B60L 2260/52; B60L 3/00; B60L 58/13; H02J 7/0063; H02J 7/0047; H02J 7/00; G01R 31/382; G06Q 50/06
See application file for complete search history.

(56) References Cited

U.S. PATENT DOCUMENTS 8,395,355 B2 3/2013 Kaita et al.
9,701,302 B2 * 7/2017 Matsunaga ........... B60W 20/40
2011/0258112 A1* 10/2011 Eder ....................... B60L 53/14
705/39

(Continued)

FOREIGN PATENT DOCUMENTS

EP 2819263 A1 12/2014
JP 2013-99035 A 5/2013
(Continued)

*Primary Examiner* — Stacy Whitmore
(74) *Attorney, Agent, or Firm* — Sughrue Mion, PLLC

(57) ABSTRACT

A vehicle includes: a motor providing driving force for the vehicle; an electricity storage device configured to feed electricity to the motor or be charged by the motor; and an electronic control unit that controls the motor, wherein: the vehicle is configured to perform an external charging of charging the electricity storage device with electricity from an external power source and an external feeding of feeding electricity from the electricity storage device to an outside of the vehicle; and the electronic control unit is configured to divide an amount of electricity stored in the electricity storage device into an amount of stored electricity for traveling and an amount of stored electricity for feeding, and to notify of at least information related to the amount of stored electricity for feeding.

6 Claims, 5 Drawing Sheets

(56) References Cited

U.S. PATENT DOCUMENTS

| | | | | |
|---|---|---|---|---|
| 2012/0053771 | A1* | 3/2012 | Yoshida | B60L 55/00 |
| | | | | 701/22 |
| 2012/0249068 | A1* | 10/2012 | Ishida | H02J 3/386 |
| | | | | 320/109 |
| 2015/0097512 | A1* | 4/2015 | Li | B60L 53/60 |
| | | | | 320/101 |
| 2015/0137752 | A1* | 5/2015 | Shinzaki | H02J 3/322 |
| | | | | 320/109 |
| 2017/0282744 | A1* | 10/2017 | Koo | B60L 11/1862 |
| 2018/0241229 | A1* | 8/2018 | Kitaoka | B60L 53/53 |
| 2019/0061545 | A1* | 2/2019 | Vargas-Reighley | |
| | | | | G01C 21/343 |
| 2019/0111805 | A1* | 4/2019 | Hidaka | B60L 58/10 |
| 2019/0156595 | A1* | 5/2019 | Manji | A01D 69/02 |
| 2019/0176640 | A1* | 6/2019 | Lee | B60L 15/2045 |
| 2019/0193711 | A1* | 6/2019 | Deshpande | B60W 10/08 |
| 2020/0006954 | A1* | 1/2020 | Miyata | H02J 3/14 |
| 2020/0070801 | A1* | 3/2020 | Staats | B60W 10/08 |

FOREIGN PATENT DOCUMENTS

| | | |
|---|---|---|
| JP | 2013-244770 A | 12/2013 |
| JP | 2014-134456 A | 7/2014 |
| JP | 2015-084643 A | 4/2015 |
| KR | 1020140060751 A | 5/2014 |
| WO | 2013001620 A1 | 1/2013 |
| WO | 2017170741 A1 | 10/2017 |

\* cited by examiner

FIG. 5

< ELECTRICITY-DEMANDING FACILITY >

DEMANDED AMOUNT OF ELECTRICITY :  ** kWh

< VEHICLE >

AMOUNT OF ELECTRICITY STORED IN BATTERY :  ** kWh
 AMOUNT OF STORED
 ELECTRICITY FOR TRAVELING:  ** kWh
 AMOUNT OF STORED
 ELECTRICITY FOR FEEDING:  ** kWh
  (ELECTRICITY SALES UNIT PRICE: ** YEN/kWh,
   ELECTRICITY SALES PRICE: ** YEN)
 PLEASE CONFIRM AMOUNTS OF STORED ELECTRICITY FOR
 TRAVELING AND FEEDING    [OK]

FIG. 6

< ELECTRICITY-DEMANDING FACILITY >

DEMANDED AMOUNT OF ELECTRICITY :  ** kWh

< VEHICLE >

AMOUNT OF ELECTRICITY STORED IN BATTERY :  ** kWh
 AMOUNT OF STORED
 ELECTRICITY FOR TRAVELING:  ** kWh
 AMOUNT OF STORED
 ELECTRICITY FOR FEEDING:  ** kWh
  < BREAKDOWN >  EXTERNAL CHARGING:  ** kWh
                 ENERGY-SAVING OPERATION:  ** kWh

FROM WHICH DO YOU PREFER TO FEED ELECTRICITY,
AMOUNT OF STORED ELECTRICITY FROM EXTERNAL CHARGING OR     [EXTERNAL CHARGING] [ENERGY-SAVING OPERATION]
AMOUNT OF STORED ELECTRICITY FROM ENERGY-SAVING OPERATION?

PLEASE CONFIRM AMOUNTS OF STORED ELECTRICITY FOR    [OK]
TRAVELING AND FEEDING

VEHICLE

INCORPORATION BY REFERENCE

The disclosure of Japanese Patent Application No. 2017-253441 filed on Dec. 28, 2017 including the specification, drawings and abstract is incorporated herein by reference in its entirety.

BACKGROUND

1. Technical Field

The disclosure relates to a vehicle, and more particularly to a vehicle including a motor and an electricity storage device.

2. Description of Related Art

As this type of technology, a feeding system for an electric vehicle has been proposed in the related art (e.g., see Japanese Patent Application Publication No. 2015-84643). In this system, direct-current electricity is fed to an electric vehicle to charge a battery of the electric vehicle, and direct-current electricity is fed from the battery of the electric vehicle to a house (building).

SUMMARY

A user of the above electric vehicle cannot get any clear idea of how much electricity should be fed from the battery to the house, even though the user sometimes drives the vehicle without charging the battery after feeding electricity from the battery to the house.

The disclosure provides a vehicle that can give a user a clear idea of how much electricity should be fed from an in-vehicle electricity storage device to the outside of the vehicle.

A vehicle of the disclosure has adopted the following solutions to achieve the above main object.

An aspect of the disclosure relates to a vehicle including: a motor providing driving force for the vehicle; an electricity storage device configured to feed electricity to the motor or be charged by the motor; and an electronic control unit that controls the motor, wherein: the vehicle is configured to perform an external charging of charging the electricity storage device with electricity from an external power source and an external feeding of feeding electricity from the electricity storage device to an outside of the vehicle; and the electronic control unit is configured to divide an amount of electricity stored in the electricity storage device into an amount of stored electricity for traveling and an amount of stored electricity for feeding used for the vehicle to perform the external feeding, and to notify of at least information related to the amount of stored electricity for feeding.

In the vehicle of the disclosure, the amount of electricity stored (amount of electricity) in the electricity storage device is divided into an amount of stored electricity (amount of electricity) for traveling and an amount of stored electricity (amount of electricity) for feeding, and notification is given of at least information related to the amount of stored electricity for feeding. Thus, a user can get a clear idea of how much electricity should be fed from the in-vehicle electricity storage device to the outside of the vehicle. Here, examples of the "information related to the amount of stored electricity for feeding" include the amount of stored electricity for feeding itself, an electricity sales unit price or an electricity sales price for feeding (selling) electricity from the electricity storage device to the outside of the vehicle, and points (e.g., points that can be used to purchase a product offered by a commercial facility etc.).

In the above aspect, the electricity storage device may be configured to perform the external feeding to feed electricity to an electricity-demanding facility that demands to be fed with electricity; and the electronic control unit may be configured to: i) divide the amount of stored electricity for feeding into a first amount of stored electricity that is based on the external charging and a second amount of stored electricity that is obtained by adding up amounts of electricity resulting from an energy-saving operation of a driver; and ii) notify of information related to the first amount of stored electricity and the second amount of stored electricity. Thus, a user can get a clear idea of the breakdown of the amount of stored electricity for feeding.

In the above aspect, the vehicle may further include an auxiliary that operates on electricity from the electricity storage device. The motor may be configured to perform regenerative driving. The auxiliary may be configured to suppress electricity consumption in response to a predetermined operation of the driver. The second amount of stored electricity may be calculated based on at least one of the following amounts of stored electricity: i) an amount of stored electricity that is charged to the electricity storage device by regenerative driving of the motor in response to a braking operation of the driver; and ii) an amount of stored electricity that is stored while discharging from the electricity storage device is suppressed as electricity consumption by the auxiliary is suppressed in response to the predetermined operation of the driver. Thus, a second amount of stored electricity can be obtained more appropriately.

In the above aspect, the vehicle may further include a ratio changing unit configured to allow a user to change a ratio between the amount of stored electricity for traveling and the amount of stored electricity for feeding. The electronic control unit may be configured to notify of the amount of stored electricity for feeding, the amount of electricity stored in the electricity storage device, and the amount of stored electricity for traveling. Thus, the user can change the ratio between the amount of stored electricity for traveling and the amount of stored electricity for feeding.

In the above aspect, the electronic control unit may be configured to, when the electricity storage device performs the external feeding to feed electricity to an electricity-demanding facility that demands to be fed with electricity, feed an amount of electricity equal to or smaller than a smaller one of the amount of stored electricity for feeding and an amount of electricity demanded by the electricity-demanding facility.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 5 is a view illustrating an example of contents (of a proposal) displayed on the display 66 in a modified example;

FIG. 6 is a view illustrating an example of contents (of a proposal) displayed on the display 66 in a modified example.

DETAILED DESCRIPTION OF EMBODIMENTS

Figure 1:
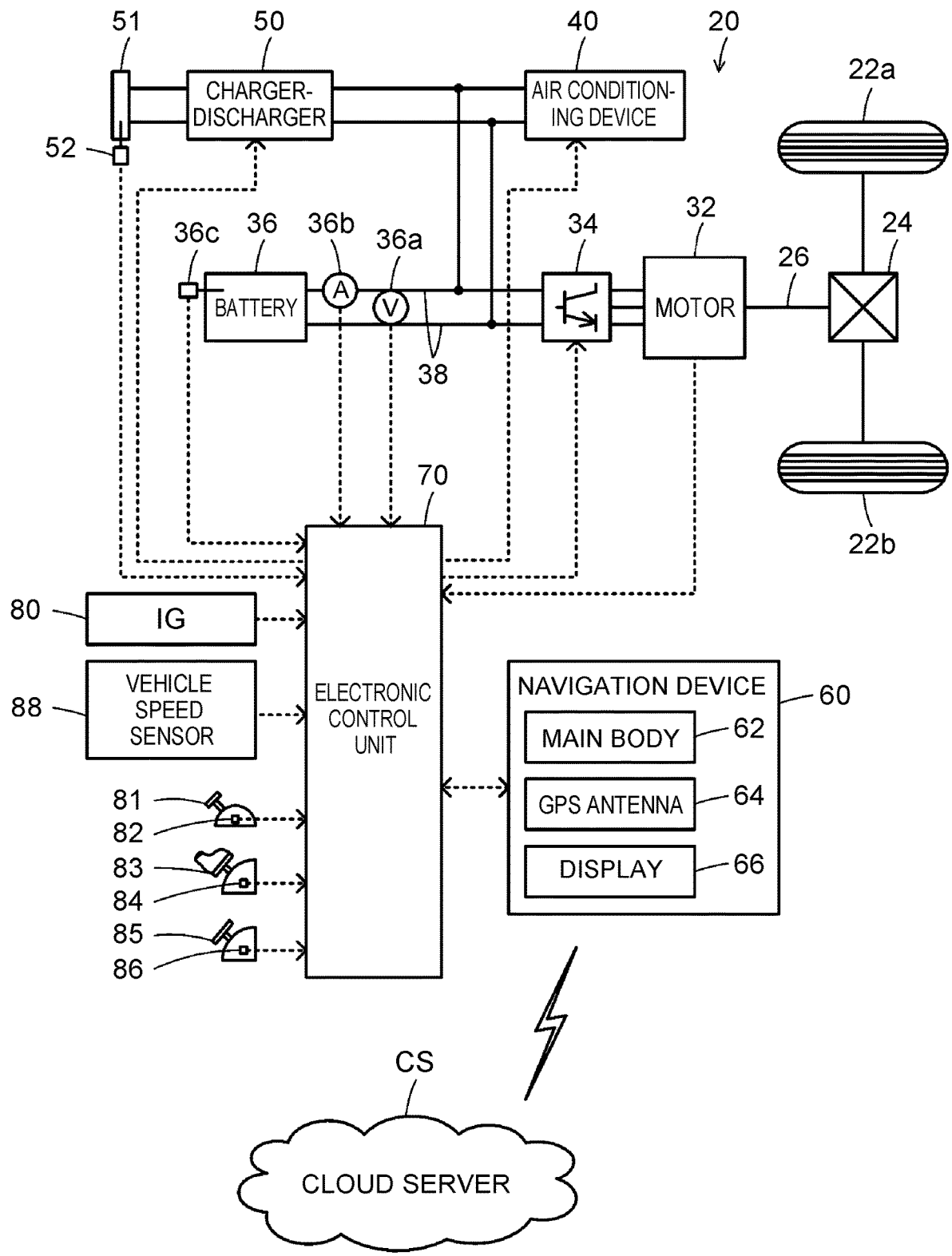
FIG. 1 is a diagram showing an overview of the configuration of an electric vehicle 20 as an embodiment of the disclosure.

Next, a mode for carrying out the disclosure will be described using an embodiment FIG. 1 is a diagram showing an overview of the configuration of an electric vehicle 20 as an embodiment of the disclosure. As shown, the electric vehicle 20 of the embodiment includes a motor 32, an inverter 34, a battery 36 as an electricity storage device, an air conditioning device 40, a charger-discharger 50, a navigation device 60, and an electronic control unit 70.

The motor 32 is configured, for example, as a synchronous generator-motor, and has a rotor connected to a drive shaft 26 that is coupled to drive wheels 22a, 22b through a differential gear 24. The inverter 34 is used to drive the motor 32 and connected to the battery 36 through electricity lines 38. The motor 32 is driven to rotate as switching of a plurality of switching elements (not shown) of the inverter 34 is controlled by the electronic control unit 70. The battery 36 is configured, for example, as a lithium-ion secondary battery or a nickel-metal hydride secondary battery. The air conditioning device 40 is connected to the electricity lines 38 and performs air conditioning of an inside of an occupant compartment by using electricity from the battery 36. Specifically, the air conditioning device 40 includes a refrigeration cycle having a compressor, a condenser, an expansion valve, and an evaporator, and performs air conditioning (cooling) of the inside of the occupant compartment as the compressor is controlled by the electronic control unit 70 and air cooled by heat exchange with the evaporator is sent into the occupant compartment by a fan.

The charger-discharger 50 is connected to the electricity lines 38, and is configured to be able to perform external charging of charging the battery 36 with electricity from a charging facility, and external feeding of feeding electricity from the battery 36 to an electricity-demanding facility, when a vehicle-side connector 51 and a facility-side connector of the charging facility or the electricity-demanding facility are connected to each other. The charger-discharger 50 is controlled by the electronic control unit 70. Here, a charging facility means a facility that can feed electricity to the electric vehicle 20, and an electricity-demanding facility means a facility that demands (desires) to be fed with electricity from the electric vehicle 20. Examples of the case where a facility demands to be fed with electricity from the electric vehicle 20 include a case where a facility including a photovoltaic power generation device and a storage battery storing electricity generated by the photovoltaic power generation device has a small amount of electricity stored in the storage battery due to cloudy weather, rainy weather, etc.

The navigation device 60 includes: a main body 62 having a recording medium, such as a hard disk, that stores therein map information etc., a CPU, a ROM, a RAM, input and output ports, and a communication port; a GPS antenna 64 that receives information related to a current location of the vehicle; and a touch-panel display 66 which displays various pieces of information including the map information, the current location of the vehicle, and a planned travel route to a destination and into which a user can input various commands. Here, the map information includes service information (e.g., information on facilities, parking lots, and charging facilities), and road information on each predetermined travel section (e.g., a section between traffic lights or intersections). The road information includes information on the distance, width, number of lanes, region (urban area or suburban area), type (general road, expressway, or toll road), gradient, legal speed limit, and number of traffic lights. The navigation device 60 is connected to the electronic control unit 70 through the communication port.

In the navigation device 60, when the user has set a destination by operating the display 66, the main body 62 sets a planned travel route from the current location to the destination based on the map information, the current location of the vehicle, and the destination, and provides route guidance by displaying the set planned travel route on the display 66.

Although this is not shown, the electronic control unit 70 is configured as a microprocessor centered around a CPU, and includes, in addition to the CPU, a ROM that stores therein a processing program, a RAM that temporarily stores therein data, input and output ports, and a communication port. Signals from various sensors are input into the electronic control unit 70 through the input port. Examples of the signals input into the electronic control unit 70 include a rotational position θm of the rotor of the motor 32 from a rotational position sensor (not shown) that detects the rotational position of the rotor of the motor 32, and phase currents Iu, Iv, Iw of the respective phases of the motor 32 from current sensors (not shown) that detect the phase currents of the respective phases of the motor 32. Other examples are a voltage Vb of the battery 36 from a voltage sensor 36a mounted between terminals of the battery 36, a current Ib of the battery 36 from a current sensor 36b mounted on an output terminal of the battery 36, and a temperature Tb of the battery 36 from a temperature sensor 36c mounted on the battery 36. A further example is a connection detection signal from a connection detection sensor 52 that detects connection of the vehicle-side connector 51 with the facility-side connector of a charging facility or an electricity-demanding facility. Further examples are an ignition signal from an ignition switch 80, and a shift position SP from a shift position sensor 82 that detects the operation position of a shift lever 81. Further examples are an accelerator operation amount Acc from an accelerator pedal position sensor 84 that detects the amount of depression of an accelerator pedal 83, a brake pedal position BP from a brake pedal position sensor 86 that detects the amount of depression of a brake pedal 85, and a vehicle speed V from a vehicle speed sensor 88.

Various control signals are output from the electronic control unit 70 through the output port. Examples of the signals output from the electronic control unit 70 include a control signal to the inverter 34 and a control signal to the charger-discharger 50. The electronic control unit 70 calculates an amount of stored electricity Sb and an electricity storage ratio SOC of the battery 36 based on an integrated value of the input-output current Ib of the battery 36 from the current sensor 36b. Here, the amount of stored electricity Sb is an amount of electricity that can be discharged from the battery 36, and the electricity storage ratio SOC is a ratio of the amount of stored electricity Sb to a total capacity Scap of the battery 36.

As mentioned above, the electronic control unit 70 is connected to the navigation device 60 through the communication port. The electronic control unit 70 is configured to be able to wirelessly communicate with a cloud server CS. The cloud server CS is configured to be able to wirelessly communicate with vehicles including the electric vehicle 20, and stores therein map information, travel history information on each vehicle, etc. The map information stored in the cloud server CS includes information on electricity-demanding facilities in addition to the map information stored in the main body 62 of the navigation device 60. The travel history information includes past travel routes, dates and times of travels, locations of parking, dates and times of parking, etc. of the vehicle.

In the electric vehicle 20 of the embodiment thus configured, the electronic control unit 70 sets a required torque Td* required for traveling (required for the drive shaft 26) based on the accelerator operation amount Acc and the vehicle speed V, sets the required torque Td* as a torque command Tm* for the motor 32, and controls switching of the switching elements of the inverter 34 such that the motor 32 is driven according to the torque command Tm*.

In the electric vehicle 20 of the embodiment, when the vehicle-side connector 51 and the facility-side connector of a charging facility are connected to each other while the vehicle is parked at home or a charging station etc. (when the connection detection sensor 52 detects connection therebetween), the electronic control unit 70 executes external charging by controlling the charger-discharger 50 such that the battery 36 is charged with electricity from the charging facility. When the electricity storage ratio SOC of the battery 36 reaches a predetermined ratio Smax, the electronic control unit 70 stops controlling the charger-discharger 50 and thus ends execution of external charging. For example, 90%, 95%, or 100% is used as the predetermined ratio Smax.

Figure 2:
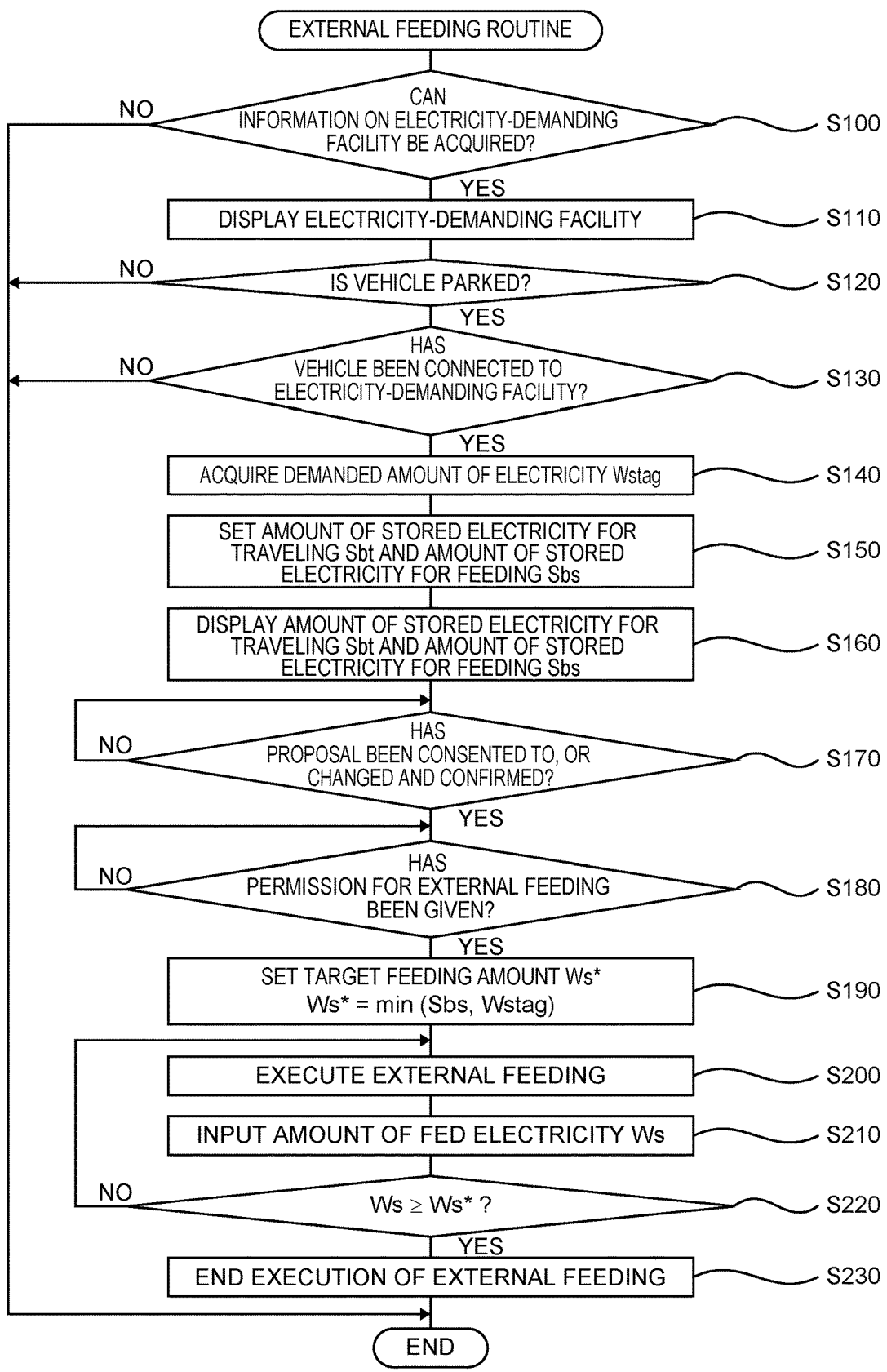
FIG. 2 is a flowchart showing an example of an external feeding routine executed by an electronic control unit 70.

Next, operations of the electric vehicle 20 of the embodiment thus configured, particularly the operations thereof when executing external feeding of feeding electricity from the battery 36 to an electricity-demanding facility will be described. FIG. 2 is a flowchart showing an example of an external feeding routine executed by the electronic control unit 70. This routine is repeatedly executed.

When the external feeding routine of FIG. 2 is executed, the electronic control unit 70 determines whether information on an electricity-demanding facility can be acquired from the cloud server CS (step S100). For example, this determination process can be performed by determining whether the electronic control unit 70 can communicate with the cloud server CS, or whether information on an electricity-demanding facility is stored in the cloud server CS. When it is determined that information on an electricity-demanding facility cannot be acquired, the electronic control unit 70 ends the current routine.

When it is determined in step S100 that information on an electricity-demanding facility can be acquired, the electronic control unit 70 displays the acquired information on an electricity-demanding facility on the display 66 (step S110). Thus, the user can be notified of the information on an electricity-demanding facility (e.g., the position).

Then, the electronic control unit 70 determines whether the vehicle is parked (step S120). When it is determined that the vehicle is parked, the electronic control unit 70 determines whether the vehicle-side connector 51 and the facility-side connector of the electricity-demanding facility have been connected to each other (step S130). When it is determined in step S120 that the vehicle is not parked, or when it is determined in step S120 that the vehicle is parked and it is determined in step S130 that the vehicle-side connector 51 and the facility-side connector of the electricity-demanding facility are not connected to each other, the electronic control unit 70 ends the current routine.

When it is determined in step S120 that the vehicle is parked and it is determined in step S130 that the vehicle-side connector 51 and the facility-side connector of the electricity-demanding facility are connected to each other, the electronic control unit 70 acquires an amount of electricity Wstag demanded by the electricity-demanding facility by communicating with the electricity-demanding facility (step S140), and sets an amount of stored electricity for traveling Sbt and an amount of stored electricity for feeding Sbs included in the amount of stored electricity Sb of the battery 36 (step S150) in a manner of, for example, setting a ratio between the amount of stored electricity for traveling Sbt and the amount of stored electricity for feeding Sbs.

Here, the amount of stored electricity for traveling Sbt is an amount of stored electricity (amount of electricity) to be secured for traveling after external feeding out of the amount of stored electricity Sb of the battery 36, and the amount of stored electricity for feeding Sbs is the amount of stored electricity (amount of electricity) that can be used for external feeding (to the electricity-demanding facility) this time out of the amount of stored electricity Sb of the battery 36. For example, the amount of stored electricity for traveling Sbt and the amount of stored electricity for feeding Sbs are set by the following first method or second method.

In the first method, the amount of stored electricity for traveling Sbt is set to a value Sbt1, and the amount of stored electricity for feeding Sbs is set to a value obtained by subtracting the amount of stored electricity for traveling Sbt from the electricity storage ratio SOC of the battery 36. Here, as the value Sbt1, a preset amount of stored electricity (an amount of stored electricity required to travel a predetermined distance), for example, an amount of stored electricity corresponding to 40%, 45%, 50%, etc. of the electricity storage ratio SOC of the battery 36 may be used. Alternatively, when a destination has been set, an amount of electricity required to travel to the destination, or an amount of stored electricity obtained by adding a margin to that amount may be used. Further, an amount of stored electricity that has been set by the user in the past (last time) may be used, or an amount of stored electricity that is set based on a past travel history (estimated as being required for traveling based on the day, time, etc.) may be used.

In the second method, the amount of stored electricity for feeding Sbs is set to a value Sbs1, and the amount of stored electricity for traveling Sbt is set to a value obtained by subtracting the amount of stored electricity for feeding Sbs from the electricity storage ratio SOC of the battery 36. Here, as the value Sbs1, a preset amount of stored electricity, for example, an amount of stored electricity corresponding to 15%, 20%, 25%, etc. of the electricity storage ratio SOC of the battery 36 may be used, or an amount of stored electricity that has been set by the user in the past (last time) may be used.

The amount of stored electricity for traveling Sbt and the amount of stored electricity for feeding Sbs may be set by a preset one of the first method and the second method, or may be set by a method set by the user. It should be understood that the amount of stored electricity for traveling Sbt and the amount of stored electricity for feeding Sbs may be set by a method other than the first method and the second method.

After thus setting the amount of stored electricity for traveling Sbt and the amount of stored electricity for feeding Sbs, the electronic control unit 70 displays the set amount of stored electricity for traveling Sbt and amount of stored electricity for feeding Sbs on the display 66 of the navigation device 60 (step S160). Thus, the amount of stored electricity for traveling Sbt and the amount of stored electricity for feeding Sbs (the ratio between the amount of stored electricity for traveling Sbt and the amount of stored electricity for feeding Sbs of the amount of stored electricity Sb of the battery 36) can be proposed to the user. Then, the electronic control unit 70 waits for the user to consent to the amount of stored electricity for traveling Sbt and the amount of stored electricity for feeding Sbs as proposed, or to make a change to the proposal and confirm the change (step S170).

Figure 3:
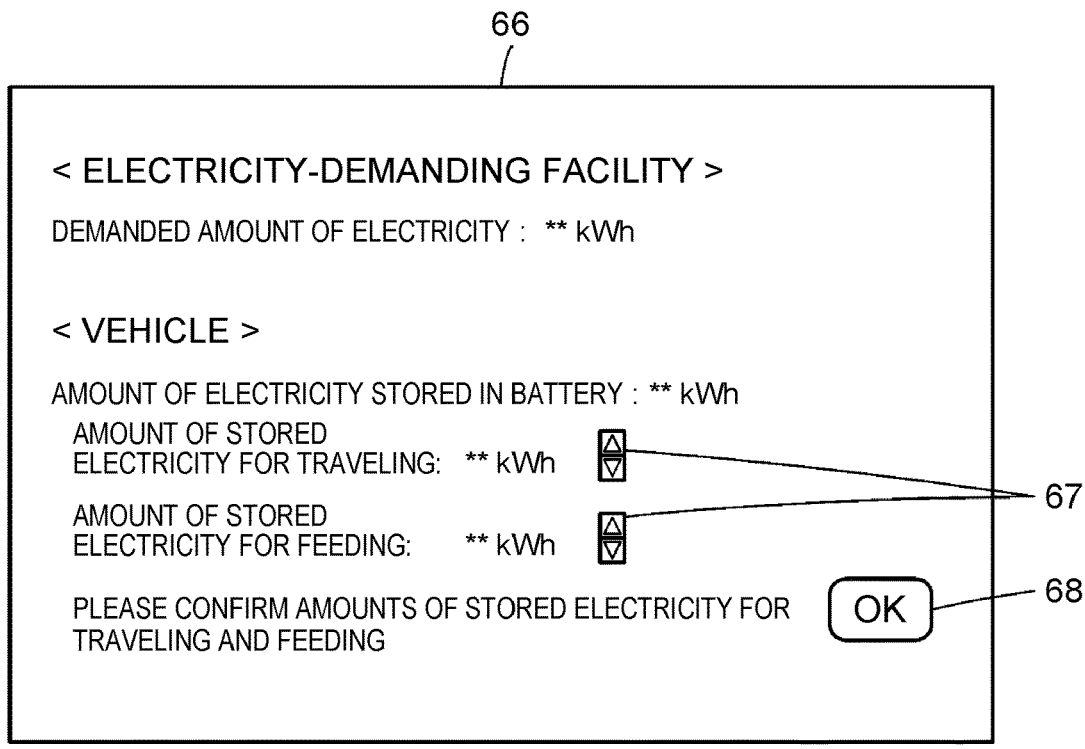
FIG. 3 is a view illustrating an example of contents (of a proposal) displayed on a display 66 of a navigation device 60.

FIG. 3 is a view illustrating an example of the contents (of the proposal) displayed on the display 66 of the navigation device 60. In the example of FIG. 3, in addition to the amount of stored electricity for traveling Sbt and the amount of stored electricity for feeding Sbs, the amount of stored electricity Sb of the battery 36, the amount of electricity Wstag demanded by the electricity-demanding facility, spin buttons 67 with which the user changes the proposed amount of stored electricity for traveling Sbt and amount of stored electricity for feeding Sbs, an OK button 68 with which the user consents to the proposal or confirms a change made to the proposal, etc. are also displayed on the display 66. When the user has touched the spin button 67 and changed one of the amount of stored electricity for traveling Sbt and the amount of stored electricity for feeding Sbs, the electronic control unit 70 changes the other of the amount of stored electricity for traveling Sbt and the amount of stored electricity for feeding Sbs such that the sum of these amounts becomes equal to the amount of stored electricity Sb of the battery 36. When the user has touched the OK button 68, the electronic control unit 70 determines that the user has consented to the proposal or that the user has confirmed a change made to the proposal.

When the user has consented to the amount of stored electricity for traveling Sbt and the amount of stored electricity for feeding Sbs as proposed, or has made a change to the proposal and confirmed the change in step S170, the electronic control unit 70 waits for the user to give permission for execution of external feeding (step S180). Permission for external feeding is given, for example, by the user through operation of the display 66 of the electric vehicle 20 or operation of a display of the electricity-demanding facility.

When permission for executing external feeding has been given, the electronic control unit 70 sets the smaller amount of electricity of the amount of stored electricity for feeding Sbs and the amount of electricity Wstag demanded by the electricity-demanding facility to a target feeding amount Ws* (step S190). Alternatively, an amount of electricity slightly smaller than the smaller amount of electricity of the amount of stored electricity for feeding Sbs and the amount of electricity Wstag demanded by the electricity-demanding facility may be set as the target feeding amount Ws*.

Then, the electronic control unit 70 executes external feeding by controlling the charger-discharger 50 such that electricity is fed from the battery 36 to the electricity-demanding facility (step S200), inputs an amount of fed electricity Ws that is an amount of electricity having been fed from the battery 36 to the electricity-demanding facility (step S210), compares the input amount of fed electricity Ws with the target feeding amount Ws* (step S220), and returns to step S200 when the amount of fed electricity Ws is smaller than the target feeding amount Ws*. Here, a value calculated based on an amount of change in the amount of stored electricity Sb of the battery 36 is input as the amount of fed electricity Ws.

The electronic control unit 70 repeatedly executes the process of steps S200 to S220. When it is determined in step S220 that the amount of fed electricity Ws has become equal to or larger than the target feeding amount Ws*, the electronic control unit 70 stops controlling the charger-discharger 50 and thus ends execution of external feeding (step S230) and ends the current routine. In this way, the target feeding amount Ws* of electricity can be fed from the electric vehicle 20 to the electricity-demanding facility.

Figure 4:
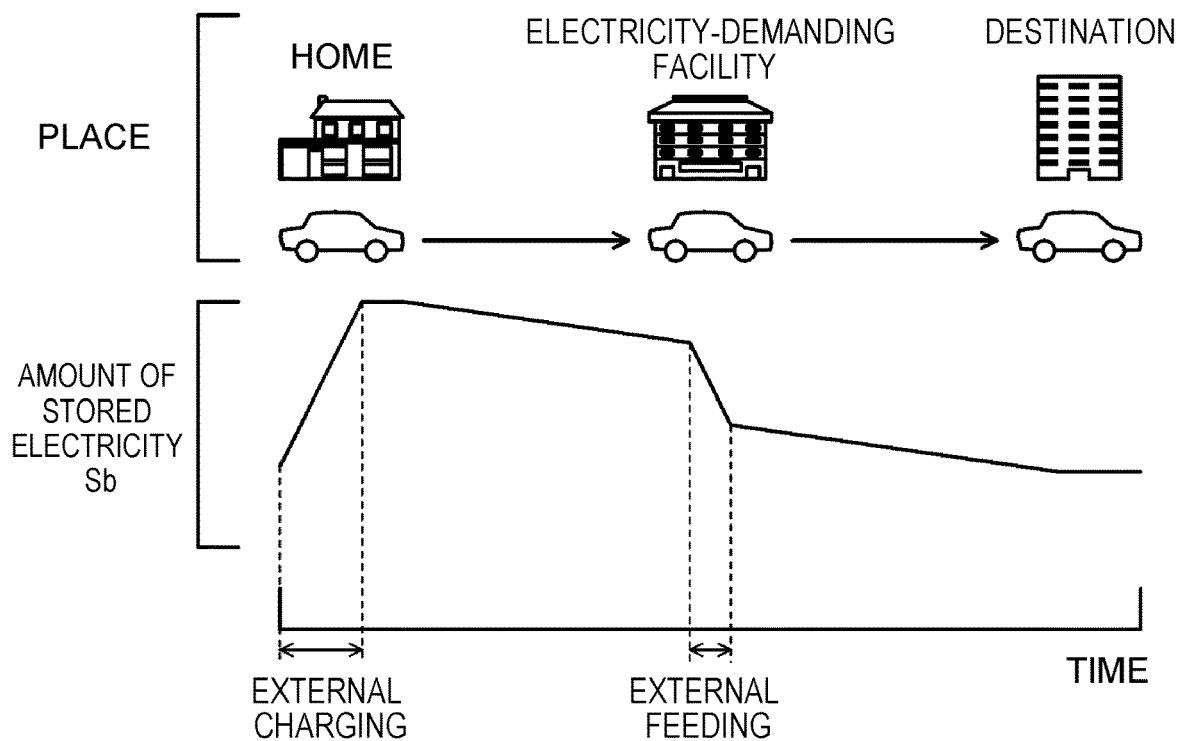
FIG. 4 is a view illustrating how the electric vehicle 20 departs from home after executing external charging at home, arrives at an electricity-demanding facility and executes external feeding, and then departs from the electricity-demanding facility and arrives at a destination.

FIG. 4 is a view illustrating how the electric vehicle 20 departs from home after executing external charging at home, arrives at an electricity-demanding facility and executes external feeding, and then departs from the electricity-demanding facility and arrives at a destination. The following two cases will be considered as examples of FIG. 4.

As the first case, a case will be considered where the electric vehicle 20 departs from home after executing external charging at home using nighttime electricity, arrives at an electricity-demanding facility in the daytime and executes external feeding, and then departs from the electricity-demanding facility and arrives at a destination. It is assumed that the electricity sales unit price (the price per unit amount of electricity) [yen/kWh] of electricity provided by a power company is a value $\alpha 11$ for daytime electricity, and a value $\alpha 12$, lower than the value $\alpha 11$, for nighttime electricity. Of course, yen is an example of the currency unit of the price in this embodiment. The currency unit of the price is not limited to yen, but should be the proper currency unit according to the country in which the present disclosure is carried out.

In the first case, setting the electricity sales unit price for external feeding to a value $\alpha 13$ that is lower than the value $\alpha 11$ and higher than the value $\alpha 12$ is advantageous for both the electric vehicle 20 side and the electricity-demanding facility side as follows. By executing external charging at the unit price of the value $\alpha 12$ and external feeding at the unit price of the value $\alpha 13$, the electric vehicle 20 side can gain a price advantage (profit) according to the difference between the value $\alpha 13$ and the value $\alpha 12$. By buying electricity at the unit price of the value $\alpha 13$ from the electric vehicle 20 instead of buying electricity from the power company at the unit price of the value $\alpha 11$, the electricity-demanding facility side can gain a price advantage (can cut down expenditure) according to the difference between the value $\alpha 11$ and the value $\alpha 13$.

As the second case, a case will be considered where the electric vehicle 20 executes external charging using only electricity generated by a photovoltaic power generation device installed at home, departs from home, arrives at an electricity-demanding facility in the daytime and executes external feeding, and then departs from the electricity-demanding facility and arrives at a destination. It is assumed that the electricity sales unit price [yen/kWh] of electricity generated by the photovoltaic power generation device is a value $\alpha 21$ until a predetermined period (e.g., 10 years) has elapsed since the installation of the photovoltaic power generation device, and that the electricity sales unit price becomes a value $\alpha 22$ lower than the value $\alpha 21$ after a lapse of the predetermined period.

In the second case, setting the unit price for external feeding to a value $\alpha 23$ that is higher than the value $\alpha 21$ and lower than the value $\alpha 11$ until the predetermined period has lapsed since the installation of the photovoltaic power generation device is advantageous for both the electric vehicle 20 side and the electricity-demanding facility side. After a lapse of the predetermined period from the installation of the photovoltaic power generation device, setting the unit price for external feeding to a value α24 that is higher than the value α22 and lower than the value α11 is advantageous for both the electric vehicle 20 side and the electricity-demanding facility side. Moreover, if the value α24 and the value α23 can be set to be equal, the electric vehicle 20 side can gain a greater advantage.

In the electric vehicle 20 of the embodiment having been described above, when the vehicle is parked and the vehicle-side connector 51 and the facility-side connector of an electricity-demanding facility are connected to each other, the amount of stored electricity for traveling Sbt and the amount of stored electricity for feeding Sbs included in the amount of stored electricity Sb of the battery 36 are set and displayed on the display 66. Thus, the user can get a clear idea of the amount of stored electricity for feeding Sbs, i.e., how much electricity should be fed from the battery 36 to the electricity-demanding facility.

In the electric vehicle 20 of the embodiment, the amount of stored electricity for traveling Sbt and the amount of stored electricity for feeding Sbs are displayed on the display 66 as shown in FIG. 3. However, instead of or in addition to the amount of stored electricity for feeding Sbs, the electricity sales unit price [yen/kWh] or the electricity sales price [yen] may be displayed. FIG. 5 is a view illustrating an example of contents (of a proposal) displayed on the display 66 in this case. In the example of FIG. 5, in addition to the contents displayed on the display 66 of FIG. 3, the electricity sales unit price, and the electricity sales price of the smaller amount of electricity of the amount of stored electricity for feeding Sbs and the amount of electricity Wstag demanded by the electricity-demanding facility (an amount of electricity corresponding to the target feeding amount Ws*) are also displayed on the display 66. Here, the electricity sales unit price is acquired through communication with the electricity-demanding facility. The electricity sales price is calculated as the product of the electricity sales unit price and the smaller amount of electricity of the amount of stored electricity for feeding Sbs and the amount of electricity Wstag demanded by the electricity-demanding facility. Thus, the user can be notified of the electricity sales unit price and the electricity sales price for executing external feeding. Instead of or in addition to the electricity sales price of the smaller amount of electricity of the amount of stored electricity for feeding Sbs and the amount of electricity Wstag demanded by the electricity-demanding facility, the electricity sales price for feeding the entire amount of stored electricity for feeding Sbs to the electricity-demanding facility may be displayed on the display 66.

In the electric vehicle 20 of the embodiment, the amount of stored electricity for traveling Sbt and the amount of stored electricity for feeding Sbs of the amount of stored electricity Sb of the battery 36 are displayed on the display 66 as shown in FIG. 3. However, in addition to the amount of stored electricity for traveling Sbt and the amount of stored electricity for feeding Sbs, the breakdown of the amount of stored electricity for feeding Sbs may also be displayed on the display 66.

FIG. 6 is a view illustrating an example of contents (of a proposal) displayed on the display 66 in this case. In the example of FIG. 6, in addition to the contents displayed on the display 66 of FIG. 3, an amount of stored electricity Sch from external charging and an amount of stored electricity Sec from an energy-saving operation as the breakdown of the amount of stored electricity for feeding Sbs, and selection buttons (an external charging button and an energy-saving operation button) 69 for determining from which one of the amount of stored electricity Sch from external charging and the amount of stored electricity Sec from an energy-saving operation, electricity is to be preferentially fed (which one of the amounts is to be reduced), are also displayed on the display 66. Here, the amount of stored electricity Sec from an energy-saving operation is an amount of stored electricity that is obtained by adding up amounts of electricity resulting from an energy-saving operation (eco-operation) of the driver. The amount of stored electricity Sec from an energy-saving operation is obtained by integrating the amount of stored electricity (amount of electricity) charged to the battery 36 by regenerative driving of the motor 32 in response to a braking operation of the driver and the amount of stored electricity (amount of electricity) that is stored while discharging from the battery 36 is suppressed as electricity consumption by the air conditioning device 40 is suppressed in response to an operation of the driver, with the amount of electricity for feeding Sbs serving as an upper limit guard value for the resulting integrated value. As the amount of stored electricity (amount of electricity) that is stored while discharging from the battery 36 is suppressed as electricity consumption by the air conditioning device 40 is suppressed in response to an operation of the driver, an amount of electricity can be considered that is stored while the driver suppresses discharging from the battery 36, compared with when the air conditioning device 40 is in an automatic mode, for example, by stopping the operation of the air conditioning device 40, adjusting the set temperature or air volume, or turning on an eco-switch (not shown) by the driver. In this modified example, the value obtained as described above is displayed as the amount of stored electricity Sec from an energy-saving operation, and a value obtained by subtracting the amount of stored electricity Sec from an energy-saving operation from the amount of stored electricity for feeding Sbs is displayed as the amount of stored electricity Sch from external charging. Thus, the user can be notified of the breakdown of the amount of stored electricity for feeding Sbs. To execute external feeding, electricity is fed preferentially from one of the amount of stored electricity Sch from external charging and the amount of stored electricity Sec from an energy-saving operation that is selected by the user through operation of the selection button 69 (the selected one of the amounts is reduced). When neither of the selection buttons 69 has been touched, electricity is fed preferentially from a predetermined one of the amount of stored electricity Sch from external charging and the amount of stored electricity Sec from an energy-saving operation (the predetermined one of the amounts is reduced). Alternatively, without the selection buttons 69 being displayed on the display 66, electricity may be fed preferentially from a predetermined one of the amount of stored electricity Sch from external charging and the amount of stored electricity Sec from an energy-saving operation (the predetermined one of the amounts may be reduced).

Figure 7:
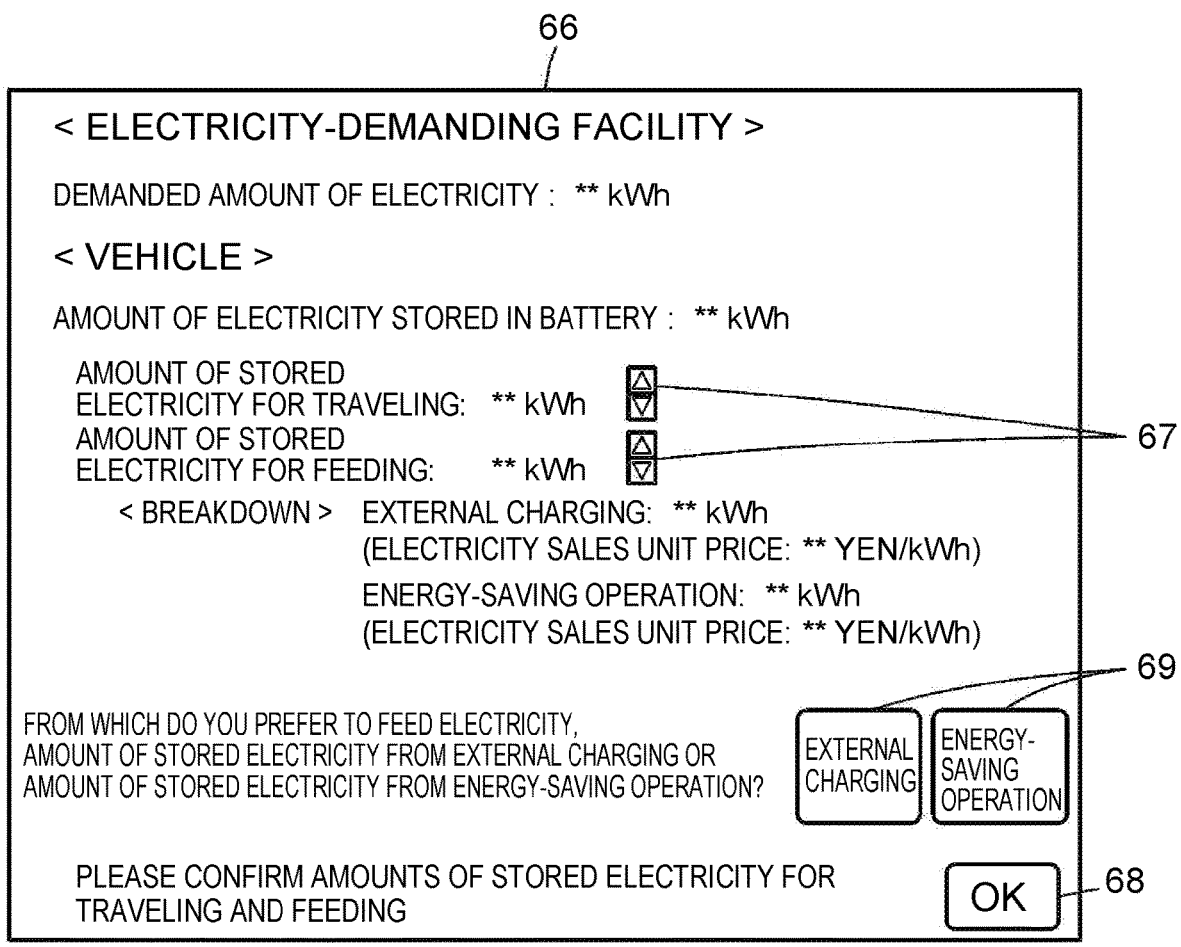
FIG. 7 is a view illustrating an example of contents (of a proposal) displayed on the display 66 in a modified example.

In this modified example, in addition to the amount of stored electricity for traveling Sbt and the amount of stored electricity for feeding Sbs, the amount of stored electricity Sch from external charging and the amount of stored electricity Sec from an energy-saving operation are also displayed on the display 66. However, information to be displayed is not limited to the amount of stored electricity Sch from external charging and the amount of stored electricity Sec from an energy-saving operation, and any information that is related to the amount of stored electricity Sch from external charging or the amount of stored electricity Sec from an energy-saving operation may be displayed. FIG. 7 is a view illustrating an example of contents (of a proposal) displayed on the display 66 in this case. In the example of FIG. 7, in addition to the contents displayed in FIG. 6, the electricity sales unit prices for feeding electricity to an electricity-demanding facility from the amount of stored electricity Sch from external charging and the amount of stored electricity Sec from an energy-saving operation are also displayed on the display 66. The electricity sales unit prices are each acquired through communication with the electricity-demanding facility. Thus, the user can check the respective electricity sales unit prices to select which of the amount of stored electricity Sch from external charging and the amount of stored electricity Sec from an energy-saving operation is to be preferentially reduced. Instead of or in addition to these electricity sales unit prices, the electricity sales price, points (e.g., points that can be used to purchase a product offered by a commercial facility etc.), etc. for feeding the entire amount of each of the amounts of stored electricity to the electricity-demanding facility may also be displayed on the display 66.

In this modified example, the amount of stored electricity Sec from an energy-saving operation is calculated based on the amount of stored electricity (amount of electricity) charged to the battery 36 by regenerative driving of the motor 32 in response to a braking operation of the driver, and the amount of stored electricity (amount of electricity) that is stored while discharging from the battery 36 is suppressed as electricity consumption by the air conditioning device 40 is suppressed in response to an operation of the driver. However, the amount of stored electricity Sec from an energy saving operation may instead be calculated based on only one of the amount of stored electricity (amount of electricity) charged to the battery 36 by regenerative driving of the motor 32 in response to a braking operation of the driver, and the amount of stored electricity (amount of electricity) that is stored while discharging from the battery 36 is suppressed as electricity consumption by the air conditioning device 40 is suppressed in response to an operation of the driver.

In the electric vehicle 20 of the embodiment, when the vehicle is parked and the vehicle-side connector 51 and the facility-side connector of an electricity-demanding facility are connected to each other, the amount of stored electricity for traveling Sbt and the amount of stored electricity for feeding Sbs (the ratio therebetween) of the amount of stored electricity Sb of the battery 36 are set and displayed on the display 66 (proposed to the user), and the user can change the proposed amount of stored electricity for traveling Sbt and amount of stored electricity for feeding Sbs (the ratio between the amount of stored electricity for traveling Sbt and the amount of stored electricity for feeding Sbs of the amount of stored electricity Sb of the battery 36). Alternatively, it is also acceptable that the user cannot change the proposed amount of stored electricity for traveling Sbt and the proposed amount of stored electricity for feeding Sbs.

In the electric vehicle 20 of the embodiment, the amount of stored electricity for traveling Sbt and the amount of stored electricity for feeding Sbs (the ratio therebetween) of the amount of stored electricity Sb of the battery 36 are displayed on the display 66. Alternatively, these amounts may be output by voice from an in-vehicle speaker.

In the electric vehicle 20 of the embodiment, when the vehicle is parked and the vehicle-side connector 51 and the facility-side connector of an electricity-demanding facility are connected to each other, the amount of stored electricity for traveling Sbt and the amount of stored electricity for feeding Sbs of the amount of stored electricity Sb of the battery 36 are set and displayed on the display 66 (proposed to the user), and the electronic control unit 70 waits for the user to consent to the amount of stored electricity for traveling Sbt and the amount of stored electricity for feeding Sbs as proposed, or to make a change to the proposal and confirm the change (steps S150 to S170). However, in addition to or instead of this, a process similar to the process of steps S150 to S170 may be executed when the ignition switch 80 has been turned on and the user has set a destination that is so far away as to exceed a predetermined distance from the current location. Here, as a destination that is so far away as to exceed a predetermined distance from the current location, a destination can be considered that meets an assumption that increasing the amount of stored electricity for traveling Sbt can reduce the number of times of charging the battery 36 required until the vehicle arrives at that destination.

In the electric vehicle 20 of the embodiment, information on an electricity-demanding facility is acquired from the cloud server CS. Alternatively, information on an electricity-demanding facility may be acquired through communication with each facility (electricity-demanding facility).

The electric vehicle 20 of the embodiment can execute external charging of charging the battery 36 with electricity from a charging facility and external feeding of feeding electricity from the battery 36 to an electricity-demanding facility. However, an object to be fed with electricity from the battery 36 (an object to sell electricity to) is not limited to an electricity-demanding facility, and may instead be external devices that are not components of the vehicle (e.g., home appliances).

The battery 36 is used as the electricity storage device in the electric vehicle 20 of the embodiment, but a capacitor may be used instead of the battery 36.

The configuration of the electric vehicle 20 including the traction motor 32 is adopted in the embodiment, but the configuration of a hybrid electric vehicle that includes an engine in addition to the motor 32 may also be adopted. Examples of the configuration of a hybrid electric vehicle include a configuration in which a motor is connected to a drive shaft coupled to drive wheels, and an engine and a power generator are also connected to the drive shaft through a planetary gear, to exchange electricity between the motor and the power generator on one side and the battery on the other side. Another example is a configuration in which a motor is connected through a transmission to a drive shaft coupled to drive wheels, and an engine is connected to the motor through a clutch, to exchange electricity between the motor and the battery. A further example is a configuration in which a motor is connected to a drive shaft coupled to drive wheels, and a power generator is connected to an engine, to exchange electricity between the motor and the power generator on one side and the battery on the other side.

The motor 32, the battery 36, and the electronic control unit 70 of the embodiment correspond to examples, respectively, of the motor, the electricity storage device, and the electronic control unit in the disclosure. Further, the air conditioning device 40 and the touch-panel display 66 correspond to examples, respectively, of the auxiliary and the rate changing unit of the disclosure.

While the mode for carrying out the disclosure has been described above using the embodiment, it should be understood that the disclosure is in no way limited to this embodiment but can be carried out in various modes within the scope of the gist of the disclosure.

The disclosure can be applied to vehicle manufacturing industry etc.

What is claimed is:

1. A vehicle comprising:
a motor providing driving force for the vehicle;
an electricity storage device configured to feed electricity to the motor or be charged by the motor; and
an electronic control unit disposed within the vehicle, the electronic control unit comprising a microprocessor and being configured to control the motor, wherein:
the vehicle is configured to perform an external charging of the electricity storage device with electricity from an external power source and perform an external feeding of electricity from the electricity storage device to an outside of the vehicle; and
the electronic control unit is configured to:
control the vehicle to be charged based on a connection with a charging facility being initiated;
acquire information indicating an amount of electricity demanded by an electricity-demanding facility through communicating with the electricity-demanding facility;
set a ratio between an amount of stored electricity for traveling and an amount of stored electricity for feeding used for the vehicle to perform the external feeding based on the acquired information;
divide an amount of electricity stored in the electricity storage device into the amount of stored electricity for traveling and the amount of stored electricity for feeding; and
notify of at least information related to the amount of stored electricity for feeding,
wherein the charging facility and electricity demanding facility are separate facilities.

2. The vehicle according to claim 1, wherein:
the electricity storage device is configured to perform the external feeding to feed electricity to the electricity-demanding facility that demands to be fed with electricity;
the electronic control unit is configured to:
i) divide the amount of stored electricity for feeding into a first amount of stored electricity that is based on the external charging and a second amount of stored electricity that is obtained by adding up amounts of electricity resulting from an energy-saving operation of a driver, the energy-saving operation comprising regenerative driving and suppressing energy consumption by auxiliary components in the vehicle; and
ii) notify of information related to the first amount of stored electricity and the second amount of stored electricity.

3. A vehicle comprising:
a motor providing driving force for the vehicle;
an electricity storage device configured to feed electricity to the motor or be charged by the motor;
an electronic control unit configured to control the motor; and
an auxiliary that operates on electricity from the electricity storage device, wherein:
the vehicle is configured to perform an external charging of the electricity storage device with electricity from an external power source and perform an external feeding of electricity from the electricity storage device to an outside of the vehicle;
the electronic control unit is configured to:
divide an amount of electricity stored in the electricity storage device into an amount of stored electricity for traveling and an amount of stored electricity for feeding used for the vehicle to perform the external feeding, and to notify of at least information related to the amount of stored electricity for feeding;
perform the external feeding to feed electricity to an electricity-demanding facility that demands to be fed with electricity;
divide the amount of stored electricity for feeding into a first amount of stored electricity that is based on the external charging and a second amount of stored electricity that is obtained by adding up amounts of electricity resulting from an energy-saving operation of a driver; and
notify of information related to the first amount of stored electricity and the second amount of stored electricity
the motor is configured to perform regenerative driving;
the auxiliary is configured to suppress electricity consumption in response to a predetermined operation of the driver; and
the second amount of stored electricity is calculated based on at least one of the following amounts of stored electricity:
i) an amount of stored electricity that is charged to the electricity storage device by regenerative driving of the motor in response to a braking operation of the driver; and
ii) an amount of stored electricity that is stored while discharging from the electricity storage device is suppressed as electricity consumption by the auxiliary is suppressed in response to the predetermined operation of the driver.

4. The vehicle according to claim 1, further comprising a ratio changing unit configured to allow a user to incrementally change the ratio between the amount of stored electricity for traveling and the amount of stored electricity for feeding, wherein the electronic control unit is configured to notify of the amount of stored electricity for feeding, the amount of electricity stored in the electricity storage device, and the amount of stored electricity for traveling.

5. The vehicle according to claim 1, wherein, the electronic control unit is configured to, when the electricity storage device performs the external feeding to feed electricity to the electricity-demanding facility that demands to be fed with electricity, feed an amount of electricity equal to or smaller than a smaller one of the amount of stored electricity for feeding and the amount of electricity demanded by the electricity-demanding facility.

6. The vehicle according to claim 1, wherein the ratio of the amount of stored electricity for traveling and the amount of stored electricity for feeding is determined based on a destination input into the electronic control unit.

* * * * *